United States Patent
Park (10) Patent No.: US 9,524,936 B2
(45) Date of Patent: Dec. 20, 2016

(54) POWER SEMICONDUCTOR MODULE AND METHOD FOR MANUFACTURING THE SAME

(71) Applicant: HYUNDAI MOTOR COMPANY, Seoul (KR)

(72) Inventor: Sung-Min Park, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 14/712,776

(22) Filed: May 14, 2015

(65) Prior Publication Data

US 2016/0111367 A1    Apr. 21, 2016

(30) Foreign Application Priority Data

Oct. 16, 2014   (KR) ........................ 10-2014-0139723

(51) Int. Cl.
| | |
|---|---|
| H01L 21/56 | (2006.01) |
| H01L 23/31 | (2006.01) |
| H01L 23/528 | (2006.01) |
| H01L 23/495 | (2006.01) |

(52) U.S. Cl.
CPC ......... *H01L 23/5283* (2013.01); *H01L 21/565* (2013.01); *H01L 23/3142* (2013.01); *H01L 23/49551* (2013.01); *H01L 23/49562* (2013.01); *H01L 23/49575* (2013.01); *H01L 2924/0002* (2013.01); *H01L 2924/181* (2013.01)

(58) Field of Classification Search
CPC ............. H01L 23/5283; H01L 25/0657; H01L 2225/06555; H01L 23/5389; H01L 23/4951; H01L 23/49517; H01L 23/49579; H01L 23/49589; H01L 23/3157; H01L 2924/00014; H01L 2924/00012; H01L 23/49562; H01L 2224/48145; H01L 23/49541
See application file for complete search history.

(56) References Cited

U.S. PATENT DOCUMENTS

| | | |
|---|---|---|
| 7,589,413 B2 | 9/2009 | Otremba et al. |
| 7,755,179 B2 | 7/2010 | Carney et al. |
| 8,188,587 B2 | 5/2012 | Jereza |
| (Continued) | | |

FOREIGN PATENT DOCUMENTS

| | | |
|---|---|---|
| EP | 2 525 394 A1 | 11/2012 |
| JP | 2005-340639 A | 12/2005 |
| (Continued) | | |

OTHER PUBLICATIONS

Extended European Search Report issued in corresponding European Patent Application No. 15167978.4, mailed on Mar. 11, 2016.

*Primary Examiner* — Jasmine Clark
(74) *Attorney, Agent, or Firm* — McDermott Will & Emery LLP (57) ABSTRACT

A power semiconductor module may include a first device and a second device spaced apart from the first device at a predetermined interval. A first assembling terminal is fixedly disposed between the first device and the second device to be a first connection terminal. A second assembling terminal is fixedly assembled to contact outer surfaces of the first device and the second device to be a second connection terminal.

16 Claims, 9 Drawing Sheets

(56) References Cited

U.S. PATENT DOCUMENTS

| | | | |
|---|---|---|---|
| 8,698,300 B2* | 4/2014 | Ko | H01L 24/16 257/686 |
| 2009/0072369 A1 | 3/2009 | Oikawa | |
| 2009/0194855 A1 | 8/2009 | Liu et al. | |
| 2013/0113114 A1* | 5/2013 | Hosseini | H01L 24/83 257/777 |
| 2013/0270706 A1 | 10/2013 | Sugimura et al. | |

FOREIGN PATENT DOCUMENTS

| | | |
|---|---|---|
| JP | 2013-069739 A | 4/2013 |
| JP | 2013-157578 A | 8/2013 |
| KR | 10-2001-0071079 A | 7/2001 |
| KR | 10-2008-0070068 A | 7/2008 |

* cited by examiner

POWER SEMICONDUCTOR MODULE AND METHOD FOR MANUFACTURING THE SAME

CROSS-REFERENCE(S) TO RELATED APPLICATION(S)

This application claims the benefit of priority to Korean Patent Application No. 10-2014-0139723 filed on Oct. 16, 2014, the entire content of which IS incorporated herein by reference.

TECHNICAL FIELD

The present disclosure relates to a power semiconductor module, and more particularly, to a power semiconductor module which directly connects internal devices through a clip-shaped terminal and a method for manufacturing the same.

BACKGROUND

A power semiconductor module includes a power device having a high current density and an insulating structure having a low heat resistance to implement a large-power and high-radiation power semiconductor module against heat.

In general, power semiconductors, such as a silicon controlled rectifier (SCR), an insulated gate bipolar mode transistor (IGBT), and a metal oxide semiconductor FET (MOSFET) or a combination thereof, are assembled within an uninsulated package.

That is, a metal tab forming a back side of a package type apparatus is electrically coupled with a semiconductor die in the package type apparatus by soldering and/or wire bonding. Soldering is for bonding the metal tab to a semiconductor die by applying heat to a solder to melt. Wire bonding is for bonding the metal tab to the semiconductor die by welding Au, Al, Cu, etc., having a wire form.

However, the power semiconductor module is a relatively high voltage of around 30 to 1000 V and therefore is designed to be operated at a higher voltage than other electronic semiconductor devices such as a logic device and/or a memory device.

Further, the power semiconductor module is used at places where a temperature is relative high such as an engine bay or a factory, and therefore, more heat radiation is generated while the power semiconductor module is operated and/or environment.

Therefore, it is important to minimize heat resistance between active apparatuses which generate power of several watts or several kilowatts to increase environment temperature.

Further, due to soldering and/or wire bonding, material costs and process costs may be increased.

SUMMARY

The present invention is directed to a power semiconductor module which directly connects internal devices through a clip-shaped terminal and a method for manufacturing the same.

Other objects and advantages of the present disclosure can be understood by the following description, and become apparent with reference to the embodiments of the present inventive concept. Also, it is obvious to those skilled in the art to which the present disclosure pertains that the objects and advantages of the present disclosure can be realized by the means as claimed and combinations thereof.

An aspect of the present inventive concept provides a power semiconductor module which directly connects internal devices through a clip-shaped terminal and a method for manufacturing the same.

In accordance with an embodiment of the present invention, a power semiconductor module includes a first device and a second device spaced apart from the first device at a predetermined interval. A first assembling terminal is fixedly disposed between the first device and the second device to be a first connection terminal. A second assembling terminal is fixedly assembled to contact outer surfaces of the first device and the second device to be a second connection terminal.

The first assembling terminal and the second assembling terminal may have a clip shape.

The power semiconductor module may further include a protective part having a protective outer surface to support the connection terminals using a sealing material.

The power semiconductor module may further include an insulating member interposed between the first assembling terminal and the second assembling terminal.

The power semiconductor module may further include an insulating member attached to an inner side of the first assembling terminal and an outer side of the second assembling terminal.

One tip of the first assembling terminal may have a straight shape.

One tip of the first assembling terminal may have a "⊏" shape.

On tip of the first assembling terminal may have a width wider than that of other portions of the first assembling terminal.

One tip of the first assembling terminal or both tips of the second assembling terminal may have a sawtooth shape.

One of the first assembling terminal or both tips of the second assembling terminal may have a curved shape.

The first device and the second device may be any one of a field effect transistor (FET), a metal oxide semiconductor FET (MOSFET), an insulated gate bipolar mode transistor (IGBT), and a power rectifying diode or a combination thereof.

The sealing material may be injected through a mold in a state in which the first assembling terminal and the second assembling terminal are pressed and is clotted.

The sealing material may be thermosetting resin.

In accordance with another embodiment of the present inventive concept, a method for manufacturing a power semiconductor module includes placing a first device and placing a second device spaced apart from the first device at a predetermined interval. A first assembling terminal which is the other connection terminal is fixedly assembled to place the first assembling terminal between the first device and the second device. A second assembling terminal which is one connection terminal is fixedly assembled to allow the second assembling terminal contacting outer surfaces of the first device and the second device.

The method may further include forming a protective part for a protective outer surface to support the assembling terminals using a sealing material.

The method may further include interposing an insulating member between the first assembling terminal and the second assembling terminal.

The method may further include attaching an insulating member to an inner side of the first assembling terminal and an outer side of the second assembling terminal.

The step of forming the protective part may include pressing the first assembling terminal and the second assembling terminal using a mold. and injecting the sealing material through the mold to clot the sealing material.

DETAILED DESCRIPTION

Since the present invention may be variously modified and have several exemplary embodiments, specific exemplary embodiments will be shown in the accompanying drawings and be described in detail in a detailed description. However, it is to be understood that the present invention is not limited to the specific exemplary embodiments, but includes all modifications, equivalents, and substitutions included in the spirit and the scope of the present inventive concept.

Throughout the accompanying drawings, the same reference numerals will be used to describe the same components.

Terms used in the specification, 'first,' 'second,' etc., may be used to describe various components, but the components are not to be interpreted to be limited to the terms. The terms are used to distinguish one component from another component.

Therefore, the first component may be referred to as the second component, and the second component may be referred to as the first component. The term 'and/or' includes a combination of a plurality of items or any one of a plurality of terms.

Unless indicated otherwise, it is to be understood that all the terms used in the specification including technical and scientific terms has the same meaning as those that are understood by those who skilled in the art.

It must be understood that the terms defined by the dictionary are identical with the meanings within the context of the related art, and they should not be ideally or excessively formally defined unless the context clearly dictates otherwise.

Hereinafter, a power semiconductor module and a method for manufacturing the same in accordance with an exemplary embodiment of the present inventive concept will be described in detail with reference to the accompanying drawings.

Figure 1:
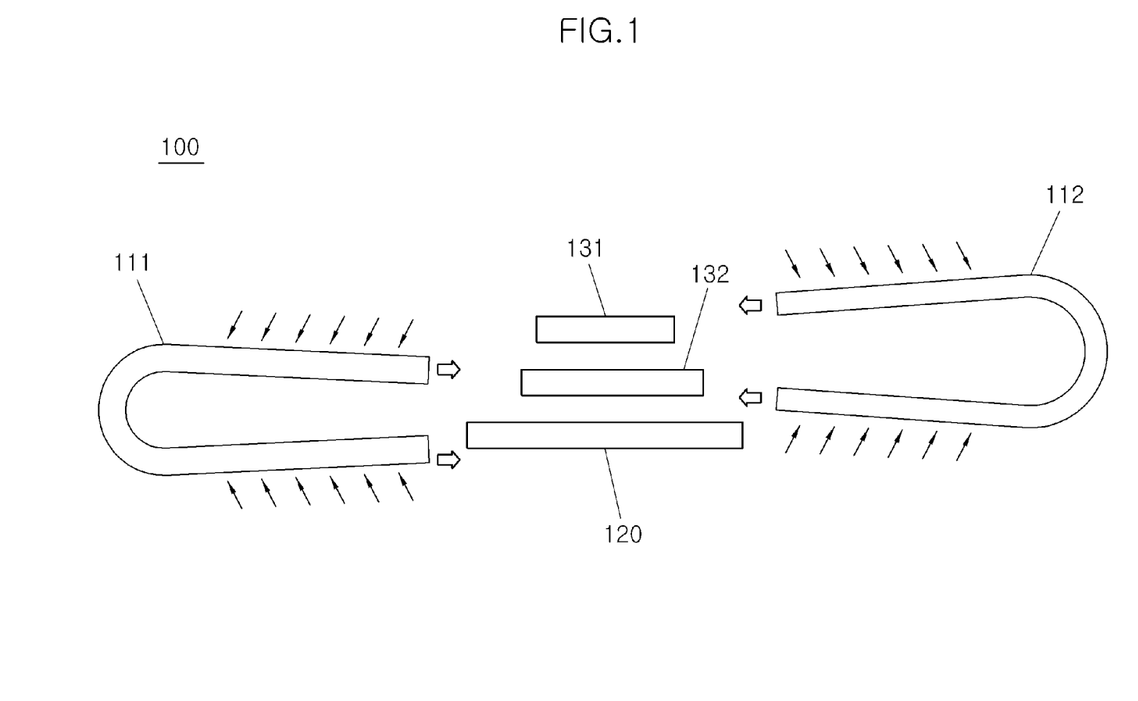
FIG. 1 is a diagram illustrating an internal connection of a power semiconductor module in accordance with a first exemplary embodiment of the present inventive concept.

FIG. 1 is a diagram illustrating an internal connection of a power semiconductor module in accordance with a first exemplary embodiment of the present inventive concept. Referring to FIG. 1, a power semiconductor module 100 includes a first device 131 and a second device 132 disposed at a predetermined interval from the first device 131. A second assembling terminal 112 is fixedly assembled to contact outer surfaces of the first device 131 and the second device 132 and thus be one connection terminal. A first assembling terminal 111 is fixedly assembled to contact between the first device 131 and the second device 132 and thus be another connection terminal.

The first assembling terminal 111 and/or the second assembling terminal 112 are made of a conductive material and have a clip shape. Therefore, the first assembling terminal 111 and/or the second assembling terminal 112 fix the first and second devices 131 and 132 with a predetermined force while contacting the first and second devices 131 and 132 with an elastic force.

The first and second devices 131 and 132 become a power semiconductor. The power semiconductor may be any one of a field effect transistor (FET), a metal oxide semiconductor FET (MOSFET), an insulated gate bipolar mode transistor (IGBT), and a power rectifying diode or a combination thereof.

The power semiconductor module 100 may be applied to an inverter system of a green car. An example of the green car may include a hybrid electric vehicle (HEV), a plug-in hybrid electric vehicle (PHEV), an electric vehicle (EV), a neighborhood electric vehicle (NEV), a fuel-cell vehicle (FCV), a clean diesel vehicle (CDV), etc.

An insulating member 120 is disposed between the first assembling terminal 111 and the second assembling terminal 112. The insulating member 120 blocks conductivity between the first assembling terminal 111 and the second assembling terminal 112 which are made of a conductive material and insulates therebetween.

FIG. 1 illustrates that both of the first assembling terminal 111 and the second assembling terminal 112 are assembled with the first device 131 and the second device 132 while contacting the first device 131 and the second device 132. However, the first assembling terminal 111 and the second assembling terminal 112 may be simultaneously assembled, and the second assembling terminal 112 may be first assembled and then the first assembling terminal 111 may be assembled. Further, the first assembling terminal 111 and the second assembling terminal 112 may be assembled in a reverse order thereto.

As the insulating member 120, polymer insulating materials such as epoxy resin, phenol resin, and polyurethane may be used.

FIG. 1 illustrates two devices and two assembling terminals for convenience of understanding, but the exemplary embodiment of the present inventive concept is not limited thereto. Therefore, the power semiconductor module may be implemented using at least two devices and at least two assembling terminals.

Figure 2:
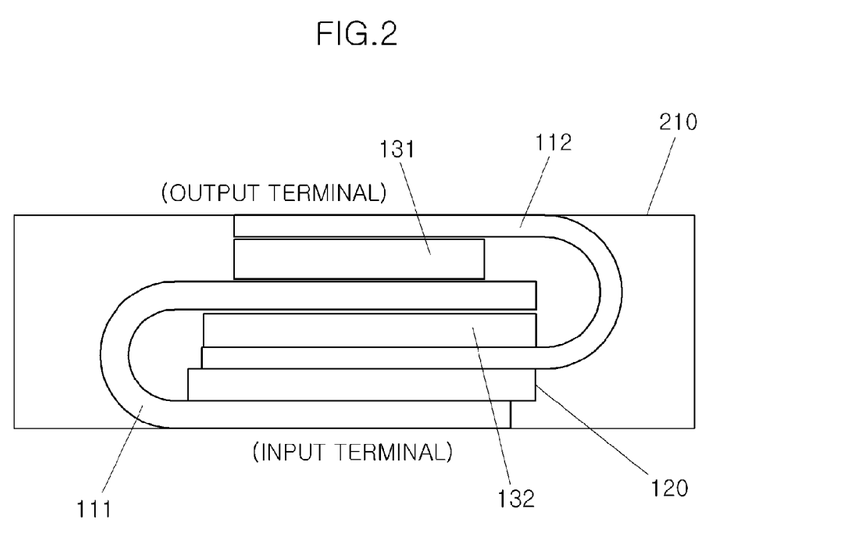
FIG. 2 is a diagram illustrating a state in which an assembling terminal is assembled as illustrated in FIG. 1 and then is finally fixed using a sealing material.

FIG. 2 is a conceptual diagram illustrating a state in which an assembling terminal is assembled as illustrated in FIG. 1 and then is finally fixed using a sealing material. Referring to FIG. 2, the first and second assembling terminals 111 and 112, the first and second devices 131 and 132, and the insulating member 120 are primarily assembled and fixed as illustrated in FIG. 1. Then, a protective part 210 is formed using a sealing material. The protective part 210 forms a protective outer surface of the power semiconductor module 100.

As the sealing material, epoxy resin is mainly used but the exemplary embodiment of the present inventive concept is not limited thereto. Therefore, thermosetting resin such as phenol resin, polyester resin, and melamine resin, silicon, and the like may be used.

Further, to form an output terminal for connection with other electronic components, one tip portion of the second assembling terminal 112 is exposed to be covered with the sealing material. Further, to form an input terminal for connection with other electronic components, one tip portion of the first assembling terminal 111 is also exposed to be covered with the sealing material.

Figure 3:
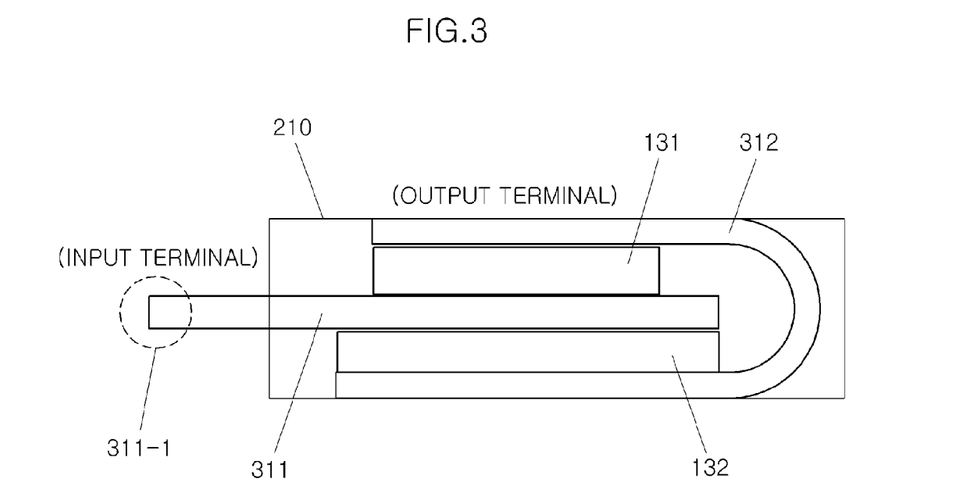
FIG. 3 is a diagram illustrating a structure of a power semiconductor module of which the input terminal is modified, in accordance with a second exemplary embodiment of the present inventive concept.
Figure 4:
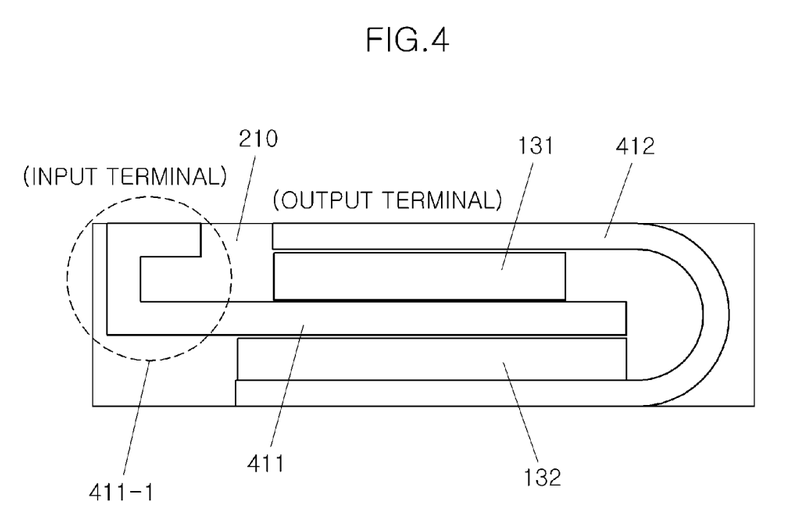
FIG. 4 is a diagram illustrating a structure of a power semiconductor module of which the input terminal is modified, in accordance with a third exemplary embodiment of the present inventive concept.

FIGS. 3 and 4 illustrate various shapes of the input terminal. That is, FIG. 3 is a diagram illustrating a structure of a power semiconductor module of which the input terminal is modified, in accordance with a second exemplary embodiment of the present inventive concept. Referring to FIG. 3, an input terminal 311-1 of a first assembling terminal 311 has a straight shape. A second assembling terminal 312 has a semi-elliptical shape.

FIG. 4 is a diagram illustrating a structure of a power semiconductor module of which the input terminal is modified, in accordance with a third exemplary embodiment of the present inventive concept. Referring to FIG. 4, an input terminal 411-1 of a first assembling terminal 411 has a "⊏" shape, and a second assembling terminal 412 has a semi-elliptical shape.

Figure 5:
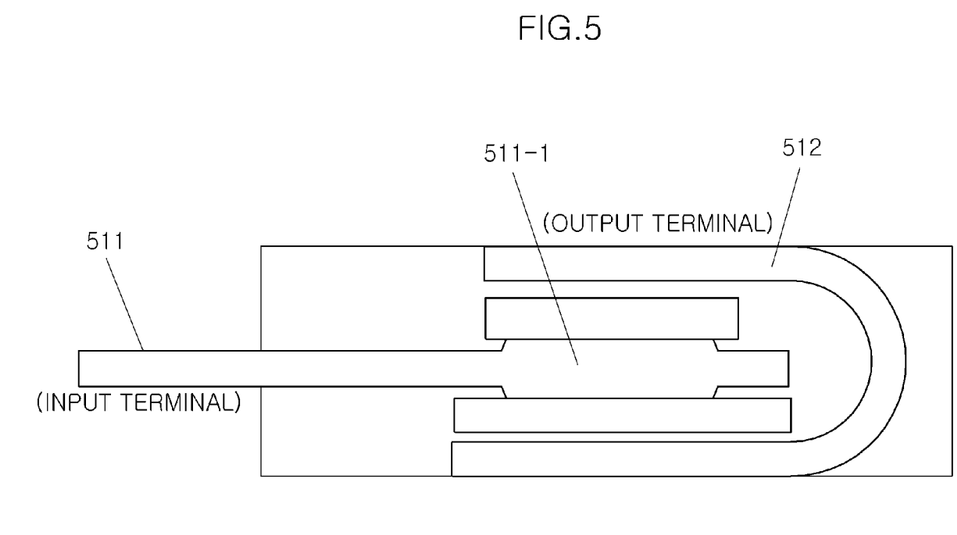
FIG. 5 is a diagram illustrating a structure of a power semiconductor module for increasing contact strength between an assembling terminal and a device, in accordance with a fourth exemplary embodiment of the present inventive concept.
Figure 6:
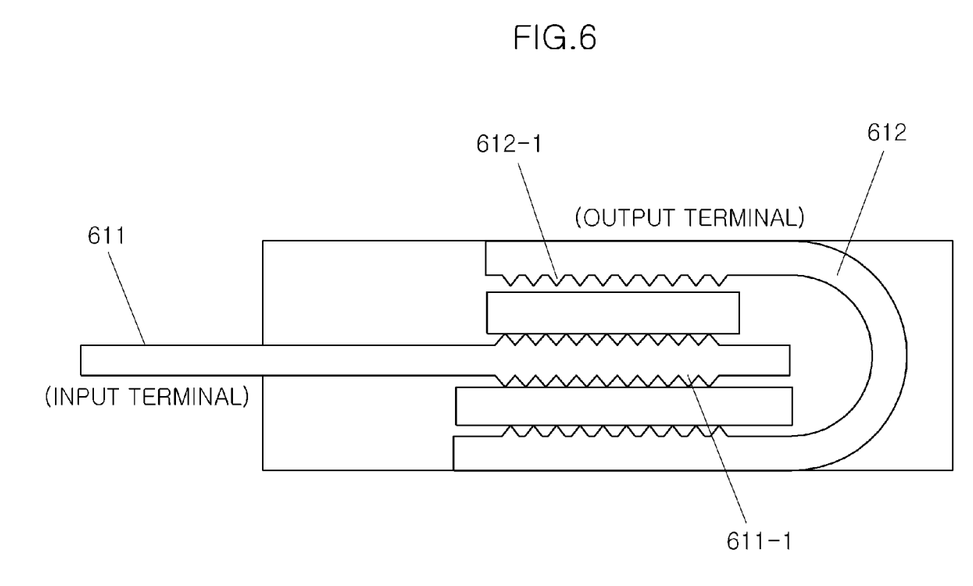
FIG. 6 is a diagram illustrating a structure of a power semiconductor module for increasing contact strength between an assembling terminal and a device, in accordance with a fifth exemplary embodiment of the present inventive concept.
Figure 7:
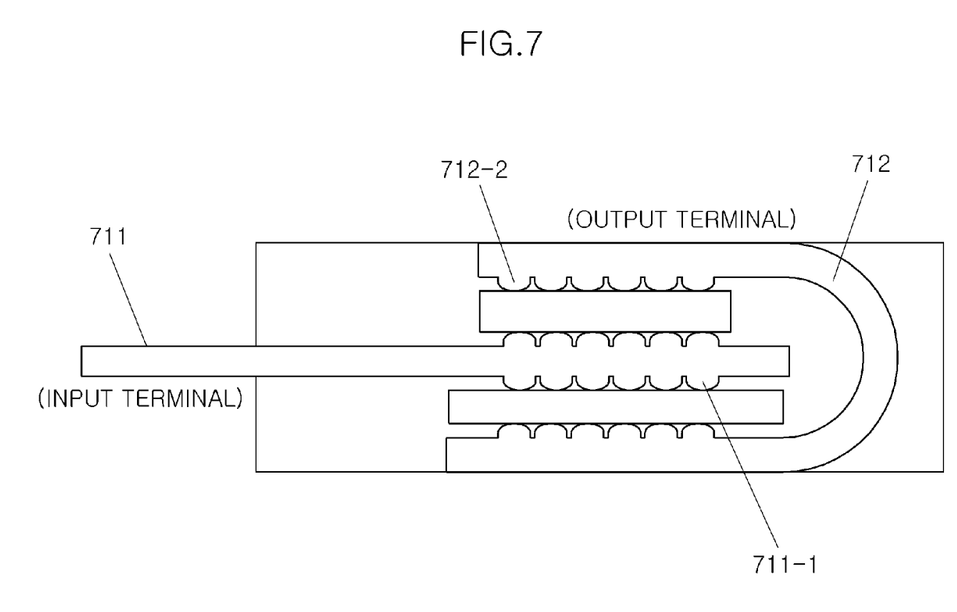
FIG. 7 is a diagram illustrating a structure of a power semiconductor module for increasing contact strength between an assembling terminal and a device, in accordance with a sixth exemplary embodiment of the present inventive concept.

FIGS. 5 to 7 variously illustrate a shape of a contact portion to increase contact strength between the assembling terminal and the device. That is, FIG. 5 is a diagram illustrating a structure of a power semiconductor module for increasing contact strength between an assembling terminal and a device, in accordance with a fourth exemplary embodiment of the present inventive concept. Referring to FIG. 5, a shape of a contact portion 511-1 which is a right tip portion of a first assembling terminal 511 has a width wider than that of other portions, and a second assembling terminal 512 has a semi-elliptical shape.

FIG. 6 is a conceptual diagram illustrating a structure of a power semiconductor module for increasing contact strength between an assembling terminal and a device, in accordance with a fifth exemplary embodiment of the present inventive concept. Referring to FIG. 6, both sides of a contact portion 611-1 of a first assembling terminal 611 have a sawtooth shape, and an inner side of a contact portion 612-1 of a second assembling terminal 612 has a sawtooth shape.

FIG. 7 is a diagram illustrating a structure of a power semiconductor module for increasing contact strength between an assembling terminal and a device, in accordance with a sixth exemplary embodiment of the present inventive concept. Referring to FIG. 7, both sides of a contact portion 711-1 of a first assembling terminal 711 have a curved shape, and only an inner side of a contact portion 712-1 of a second assembling terminal 712 has a curved shape.

Figure 8:
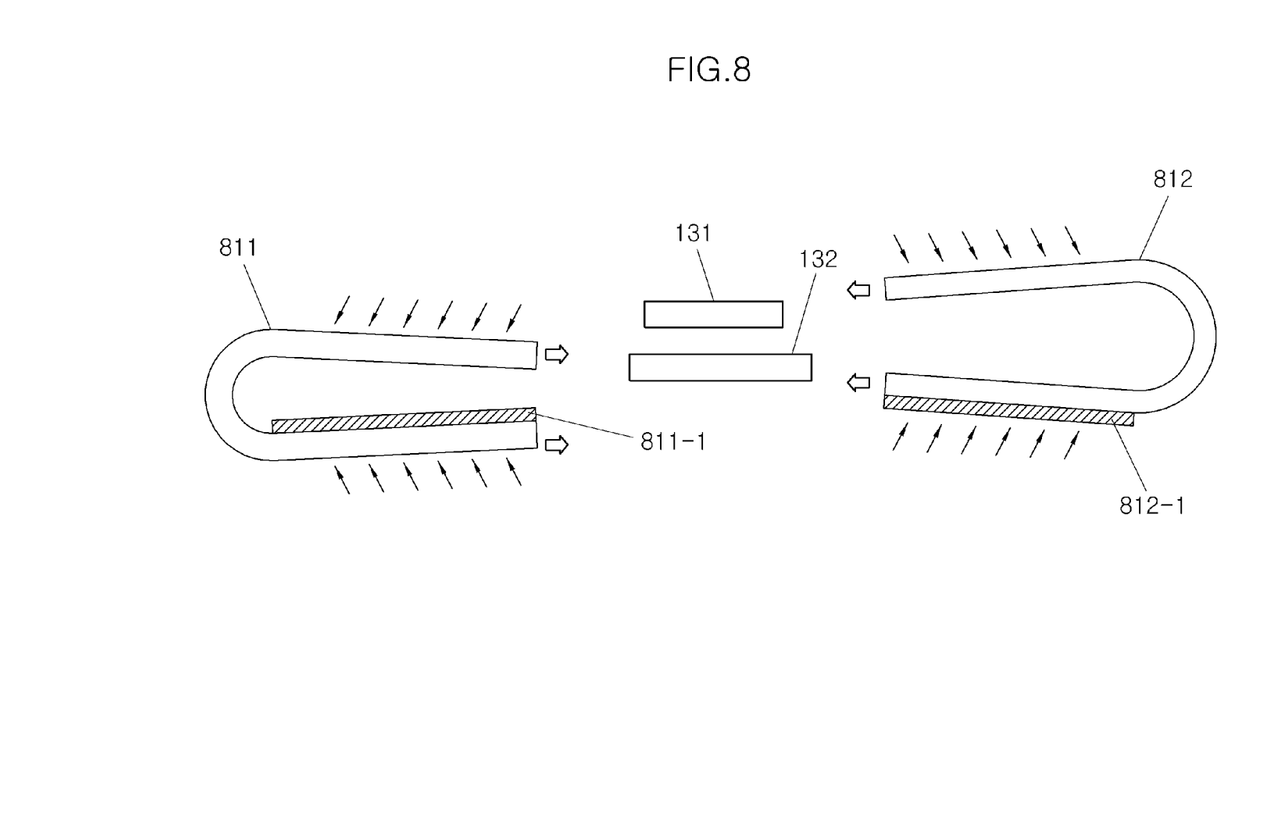
FIG. 8 is a diagram illustrating an internal connection of a power semiconductor module in a state in which an insulating layer is attached to an assembling terminal, in accordance with a seventh exemplary embodiment of the present inventive concept.

FIG. 8 is a diagram illustrating an internal connection of a power semiconductor module in a state in which an insulating layer is attached to an assembling terminal, in accordance with a seventh exemplary embodiment of the present inventive concept. Referring to FIG. 8, an inner side of the first assembling terminal 811 is attached with a first insulating member 811-1, and an outer side of a second assembling terminal 812 is attached with a second insulating member 812-1.

In this case, unlike the structure illustrated in FIG. 1, the insulating members 811-1 and 812-1 are attached to the assembling terminals 811 and 812, and therefore, a process is simplified.

Figure 9:
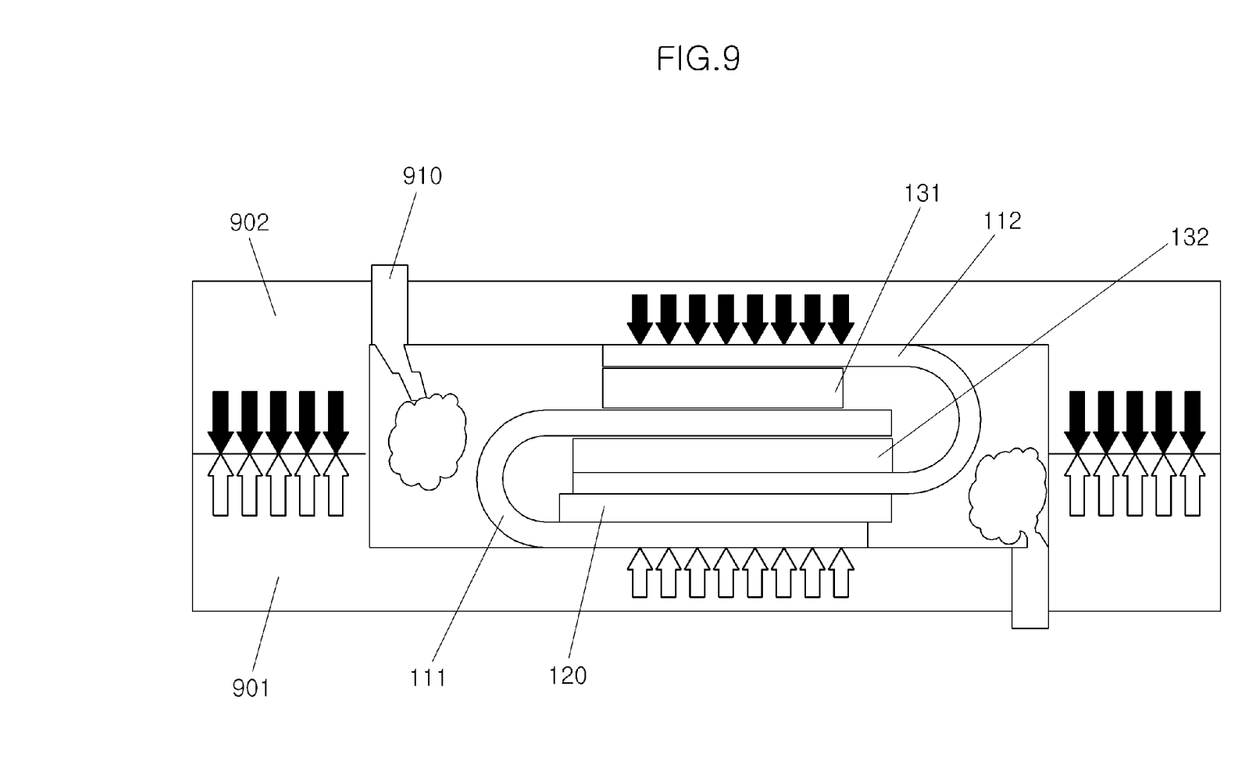
FIG. 9 is a diagram illustrating a state in which contact strength between an assembling terminal and a device is more reinforced using a mold, in accordance with an eighth exemplary embodiment of the present inventive concept.

FIG. 9 is a diagram illustrating a state in which contact strength between an assembling terminal and a device is more reinforced using a mold, in accordance with an eighth exemplary embodiment of the present inventive concept. Referring to FIG. 9, the first and second assembling terminals 111 and 112 and the first and second devices 131 and 132 which are primarily assembled are inserted into a lower mold frame 901 and an upper mold frame 902. In this state, the first and second assembling terminals 111 and 112 and the first and second devices 131 and 132 are additionally in a secondary contact state by pressing the lower mold frame 901 and the upper mold frame 902. In the secondary contact state, a sealing material 910 is injected through the lower mold frame 901 and the upper mold frame 902, respectively. The injected sealing material is hardened (or clotted) after a predetermined time lapses. Therefore, a final fixing force may be secured.

Figure 10:
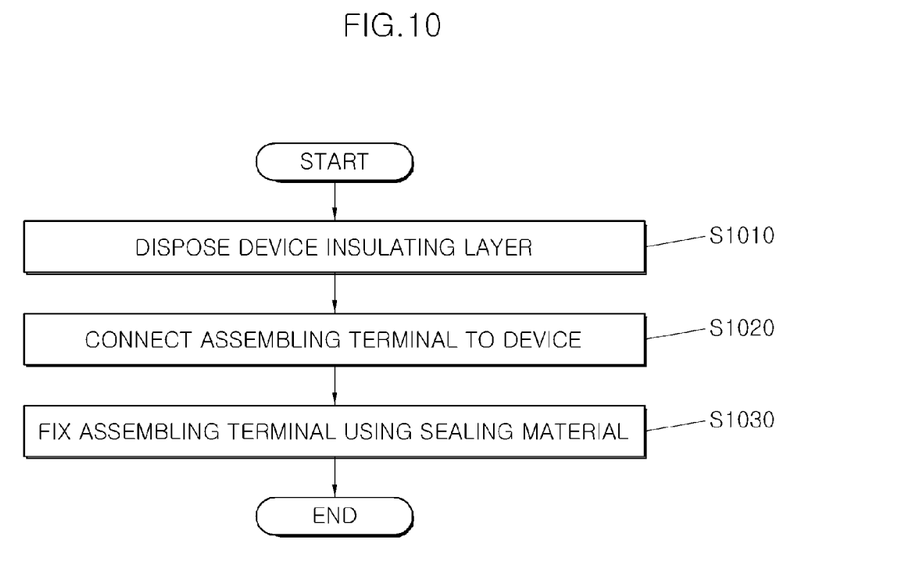
FIG. 10 is a flow chart illustrating a process of manufacturing a power semiconductor module using an assembling terminal in accordance with an exemplary embodiment of the present inventive concept.

FIG. 10 is a flow chart illustrating a process of manufacturing a power semiconductor module using an assembling terminal in accordance with an exemplary embodiment of the present inventive concept. The first device 131, the second device 132, and/or the insulating member 120, etc., are disposed at a predetermined interval (step S1010). The second assembling terminal 112 which is the output terminal is fixedly assembled to contact the outer surface of the first device 131 and the second device 132. The first assembling terminal 111 which is the input terminal is fixedly assembled to contact between the first device 131 and the second device 132 (step S1020). Further, the assembling order may be reversed thereto, and the assembling may be simultaneously performed.

The protective part 210 for the protective outer surface is formed to maintain the fixedly assembled state using the sealing material (step S1030). The step of forming the protective part (S1030) may further include pressing the first assembling terminal and the second assembling terminal using the mold and injecting the sealing material through the mold to clot the sealing material.

In accordance with the exemplary embodiments of the present inventive concept, it is possible to directly connect among the internal devices through the clip-shaped terminal without hetero adhesives.

Further, in accordance with the exemplary embodiments of the present inventive concept, the additional bonding materials and/or the soldering process and the wire bonding process are not required, and therefore, process costs are reduced and space efficiency are increased.

In addition, the metallic clip shape is used, and therefore, the double side cooling structure may be implemented, thereby improving performance.

The foregoing exemplary embodiments are only examples to allow a person having ordinary skill in the art to which the present inventive concept pertains (hereinafter, referred to as "those skilled in the art") to easily practice the present disclosure. The present inventive concept is not limited to the foregoing exemplary embodiments and the accompanying drawings, and therefore, a scope of the present inventive concept is not limited to the foregoing exemplary embodiments. Accordingly, it will be apparent to those skilled in the art that substitutions, modifications, and variations can be made without departing from the spirit and scope of the disclosure as defined by the appended claims and can also belong to the scope of the present disclosure.

What is claimed is:

1. A power semiconductor module, comprising:
   a first device;
   a second device spaced apart from the first device at a predetermined interval;
   a first assembling terminal fixedly disposed between the first device and the second device to be a first connection terminal;
   a second assembling terminal fixedly disposed to contact outer surfaces of the first device and the second device to be a second connection terminal; and
   an insulating member interposed between the first assembling terminal and the second assembling terminal.

2. The power semiconductor module of claim 1, wherein the first assembling terminal and the second assembling terminal have a clip shape.

3. The power semiconductor module of claim 1, further comprising:
   a protective part having a protective outer surface to support the first and second connection terminals using a sealing material.

4. The power semiconductor module of claim 1, wherein one tip of the first assembling terminal has a straight shape.

5. The power semiconductor module of claim 1, wherein one tip of the first assembling terminal has a "⊏" shape.

6. The power semiconductor module of claim 1, wherein one tip of the first assembling terminal has a width wider than that of other portions of the first assembling terminal.

7. The power semiconductor module of claim 1, wherein one tip of the first assembling terminal or both tips of the second assembling terminal have a sawtooth shape.

8. The power semiconductor module of claim 1, wherein one tip of the first assembling terminal or both tips of the second assembling terminal have a curved shape.

9. The power semiconductor module of claim 1, wherein the first device and the second device are any one of a field effect transistor (FET), a metal oxide semiconductor FET (MOSFET), an insulated gate bipolar mode transistor (IGBT), and a power rectifying diode or a combination thereof.

10. The power semiconductor module of claim 3, wherein the sealing material is injected through a mold in a state in which the first assembling terminal and the second assembling terminal are pressed and is clotted.

11. The power semiconductor module of claim 3, wherein the sealing material is thermosetting resin.

12. A method for manufacturing a power semiconductor module, comprising steps of:
   placing a first device and placing a second device to be spaced apart from the first device at a predetermined interval;
   assembling fixedly a first assembling terminal which is a first connection terminal to place the first assembling terminal between the first device and the second device;
   assembling fixedly a second assembling terminal which is a second connection terminal to allow the second assembling terminal contacting outer surfaces of the first device and the second device; and
   interposing an insulating member between the first assembling terminal and the second assembling terminal.

13. The method of claim 12, wherein the first assembling terminal and the second assembling terminal have a clip shape.

14. The method of claim 12, further comprising:
   forming a protective part having a protective outer surface to support the assembling terminals using a sealing material.

15. The method of claim 14, wherein the step of forming the protective part comprises:
   pressing the first assembling terminal and the second assembling terminal using a mold; and
   injecting the sealing material through the mold to clot the sealing material.

16. The method of claim 14, wherein the sealing material is thermosetting resin.

* * * * *